(12) United States Patent
Tanaka et al.

(10) Patent No.: US 7,300,326 B2
(45) Date of Patent: Nov. 27, 2007

(54) LED DEVICE AND METHOD FOR MANUFACTURING THE SAME

(75) Inventors: Minoru Tanaka, Tokyo (JP); Tomohisa Tanaka, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 171 days.

(21) Appl. No.: 11/269,667

(22) Filed: Nov. 9, 2005

(65) Prior Publication Data

US 2006/0103302 A1   May 18, 2006

(30) Foreign Application Priority Data

Nov. 10, 2004 (JP) .............................. 2004-32676

(51) Int. Cl.
*H01J 9/26* (2006.01)
*H01J 9/32* (2006.01)

(52) U.S. Cl. .............................. 445/25; 445/24; 438/25; 438/26; 438/27; 438/28; 438/29

(58) Field of Classification Search ............ 445/24–25; 438/25–29; 313/512
See application file for complete search history.

(56) References Cited

U.S. PATENT DOCUMENTS

| 831,311 A | 9/1906 | Strootman et al. |
| 6,066,861 A | 5/2000 | Hohn et al. ................... 257/99 |
| 6,245,259 B1 | 6/2001 | Hohn et al. ............ 252/301.36 |

(Continued)

FOREIGN PATENT DOCUMENTS

| DE | 723479 | 8/1942 |

(Continued)

OTHER PUBLICATIONS

Search Report for European Patent App. No. 07003902 (Apr. 27, 2007).

*Primary Examiner*—Mariceli Santiago
*Assistant Examiner*—José M Diaz
(74) *Attorney, Agent, or Firm*—Cermak Kenealy & Vaidya LLP

(57) ABSTRACT

An LED device manufacturing method can produce an LED device that can emit light of a given color tone by additive color mixture of light emitted from an LED chip and light obtained by wavelength conversion of the light emitted from the LED chip. The wavelength conversion can be accomplished by using a wavelength conversion material, such as a fluorescent material. The LED device can have good efficiency of extracting light from the LED and can have high luminous intensity. First cups and second cups can be formed in a substrate including a pair of conductor patterns formed on an insulating portion. The first and second cups can have co-planar bottom surfaces. LED chips can be mounted on die bonding pads that are provided on the bottoms of the first cups. The die bonding pads can be connected to one of the conductor patterns. An upper electrode of each LED chip can be connected to a wire bonding pad extending from the other conductor pattern via a bonding wire. A fluorescent resin containing a transparent resin with a fluorescent material added thereto can be injected into the second cup and then dispersed to fill the first and second cups with the fluorescent resin due to the resin's natural flow. A lens made of a transparent resin can be formed above each LED chip.

21 Claims, 5 Drawing Sheets

U.S. PATENT DOCUMENTS

| | | | |
|---|---|---|---|
| 6,277,301 B1 | 8/2001 | Hohn et al. | 252/301.36 |
| 6,345,903 B1* | 2/2002 | Koike et al. | 362/249 |
| 6,576,930 B2 | 6/2003 | Reeh et al. | 257/98 |
| 6,592,780 B2 | 7/2003 | Hohn et al. | 252/301.36 |
| 6,599,768 B1* | 7/2003 | Chen | 438/22 |
| 6,613,247 B1 | 9/2003 | Hohn et al. | 252/301.36 |
| 6,669,866 B1 | 12/2003 | Kummer et al. | 252/301.4 R |
| 6,707,247 B2* | 3/2004 | Murano | 313/501 |
| 6,774,401 B2 | 8/2004 | Nakada et al. | 257/82 |
| 6,809,342 B2 | 10/2004 | Harada | 257/79 |
| 6,812,500 B2 | 11/2004 | Reeh et al. | 257/98 |
| 2002/0079837 A1* | 6/2002 | Okazaki | 313/512 |
| 2006/0170332 A1* | 8/2006 | Tamaki et al. | 313/498 |

FOREIGN PATENT DOCUMENTS

| | | |
|---|---|---|
| JP | 10-190065 | 7/1998 |
| JP | 2000252524 A * | 9/2000 |
| JP | 2001-127346 | 5/2001 |
| JP | 2001-196639 | 7/2001 |
| JP | 2001-210872 | 8/2001 |
| JP | 2001-345483 | 12/2001 |
| JP | 2002-324917 | 11/2002 |
| JP | 2002324917 A * | 11/2002 |
| JP | 2003-258310 | 9/2003 |
| JP | 2004-056075 | 2/2004 |
| WO | WO2004/100265 | 11/2004 |
| WO | WO2006/013495 | 2/2006 |

\* cited by examiner

LED DEVICE AND METHOD FOR MANUFACTURING THE SAME

This application claims the priority benefit under 35 U.S.C. § 119 of Japanese Patent Application No. 2004-326276 filed on Nov. 10, 2004, which is hereby incorporated in its entirety by reference.

BACKGROUND OF THE INVENTION

1. Field of the Invention

The invention relates to an LED device manufacturing method and LED device. Particularly, the invention relates to a method for manufacturing an LED device and an LED device that emits light of a given color tone by additive color mixture. The additive color mixture includes mixing light emitted directly from an LED chip and light that has been obtained by wavelength conversion of some of the light emitted from the LED chip by use of a wavelength conversion material, e.g., fluorescent material.

2. Description of the Related Art

An LED chip can emit light having a steep spectrum distribution. In order to achieve an LED device for emitting white light using an LED chip as a light source, additive color mixture has been adopted. The additive color mixture is achieved by mixing the light emitted from the LED chip with light obtained by wavelength conversion of the light emitted from the LED chip by means of a wavelength conversion material such as a fluorescent material that is excited by the light emitted from the LED chip.

When an LED chip that emits blue light is used, for example, a fluorescent material that is excited by the blue light and converts the blue color into yellow or a complementary color of blue is used. Thus, white light can be obtained by additive color mixture of the blue light emitted from the LED chip and the yellow light obtained by wavelength conversion by means of the above fluorescent material.

Alternatively, two fluorescent materials that are excited by the blue light and convert the blue light into green light and red light, respectively, may be used. In this case, white light can also be obtained by additive color mixture of the blue light emitted from the LED chip with the green light and the red light obtained by wavelength conversion by means of the above two fluorescent materials.

When an LED chip that emits ultraviolet light rays is employed, three fluorescent materials that are excited by the ultraviolet rays and convert the ultraviolet rays into blue light, green light, and red light, respectively, are used. In this case, white light can also be obtained by additive color mixture of the blue light, the green light, and the red light obtained by wavelength conversion by means of the above three fluorescent materials.

Moreover, light of various color tones other than white light can be obtained by appropriately combining a color of light emitted from an LED chip with a fluorescent material serving as a wavelength conversion member.

The aforementioned LED device that emits light of a different color tone from that of light emitted from its light source (by exciting a fluorescent material with the light emitted from the light source to cause wavelength conversion) may have a structure as shown in FIG. 1, for example. This type of LED device has a pair of conductor patterns 50 and 51 formed on surfaces of an insulating substrate so as to serve as a double-face through-hole substrate 52. The substrate 52 has a cone-shaped concave portion 53 formed therein. One conductive pattern 50 forms a bottom 54 of the concave portion 53 and serves as an electrode portion provided on the rear surface of the insulating substrate. The other conductor pattern 51 formed on the top surface of the insulating substrate extends to the rear surface through a through hole 55 and forms another electrode portion provided on the rear surface.

An LED chip 56 is mounted on the bottom 54 of the concave portion 53, or on a part of the conductor pattern 50, via a conductive adhesive. A lower electrode of the LED chip 56 is electrically connected to the conductor pattern 50. An upper electrode of the LED chip 56 is electrically connected to the conductor pattern 51 via a bonding wire 57.

A first resin 58 into which a fluorescent material for wavelength conversion is added is filled in the concave portion 53 in which the LED chip 56 has been mounted so as to embed and encapsulate the LED chip 56. Then, a resin encapsulation including a second resin 59 that contains a transparent epoxy resin as a major component is formed on the double-face through-hole substrate 52 including the concave portion 53. A hemispherical condenser 60 is also formed above the center of the double-face through-hole substrate 52 and can be integrated with the encapsulation of the second resin 59 (see Japanese Patent Laid-Open Publication No. 2002-324917, for example).

As shown in FIG. 2, another LED device is known that will be described as a conventional technique and is disclosed in Japanese Patent Laid-Open Publication No. 2003-258310. This LED device has a pair of conductor patterns 70 and 71 formed on an insulating substrate in such a manner that each conductor pattern extends from a top surface of the insulating substrate to a rear surface via a side face, thereby forming a wiring substrate 72. An LED chip 73 is mounted on one conductor pattern 70 via a silver adhesive paste. A pair of electrodes that are formed on the top of the LED chip 73 are connected to the conductor patterns 70 and 71 via bonding wires 74 and 75, respectively, so as to electrically connect the electrodes to the conductor patterns 70 and 71. The LED chip 73 and the bonding wires 74 and 75 are encapsulated with an encapsulating resin 77 containing a transparent resin formed of an epoxy resin, for example, and a fluorescent material 76.

In the conventional LED device configured like that disclosed in Japanese Patent Laid-Open Publication No. 2002-324917, the LED chip mounted in the concave portion is embedded and encapsulated by filling the concave portion with a first resin into which a material for wavelength conversion is added. Thus, a light-emitting surface of the LED chip is in direct contact with the first resin. Therefore, a color tone of light that is emitted from the LED chip and that is transmitted through the first resin is directly changed by variation of a thickness of the first resin on the light-emitting surface of the LED chip. Accordingly, control of the amount of the first resin in the concave portion is important in order to keep a color tone of light emitted from the LED uniform and highly reproducible.

One of the typical requirements of an LED device is reduction of its size. Thus, making the dimensions of the concave portion in which the LED chip is mounted as small as possible is often desired. In this case, however, the amount of the first resin in the concave portion is very small and therefore it is difficult to control the amount of the first resin and to reproduce that amount.

When the first resin is supplied into the concave portion, a discharging device for discharging liquid of a constant amount, such as a dispenser, is generally used to supply a constant amount of the first resin discharged from a nozzle of the device into the concave portion. However, in the LED chip mounted at the substantial center portion of the concave portion, the bonding wire extends above an opening of the concave portion and is arranged to cross the opening of the concave portion. Thus, the bonding wire obstructs the resin discharged from the nozzle of the device, making injection of the resin unstable. Therefore, the amount and characteristics of the injected resin are unstable.

On the other hand, in the conventional LED device disclosed in Japanese Patent Laid-Open Publication No. 2003-258310, when the encapsulating resin that includes the transparent resin and the fluorescent material is heated to be hardened, the fluorescent material which has a larger specific gravity than that of the transparent resin settles down due to a difference in specific gravity between the fluorescent material and the transparent resin. Thus, it is difficult to disperse the fluorescent material uniformly in the encapsulating resin. Moreover, it is also difficult to consistently achieve a mixing ratio of the transparent resin and the fluorescent material in the encapsulating resin with high precision and high reproducibility. Accordingly, uniformity of light emitted from the LED to the outside (to the air) is impaired and a tone difference between products can occur.

In addition, when a convex condenser is provided on the light-emitting surface of the above-described LED chip and on an optical axis of the LED chip, light emitted from the LED chip is diffused by the fluorescent material contained in the encapsulating resin. Thus, a required focusing effect of the lens, or a required light distribution property, can not be obtained.

In a conventional technique, the fluorescent resin is directly injected into a first cup. However, a bonding wire extends above the opening of the first cup in which the LED chip is mounted approximately at the center to cross the opening of the first cup. Thus, injection of the fluorescent resin discharged from the nozzle of the device into the first cup is not assured, because the bonding wire obstructs that injection. For this reason, the injection amount may not be stable.

SUMMARY OF THE INVENTION

According to an aspect of the invention an LED device manufacturing method and LED device can be provided that has a small variation in color tone between products, has good efficiency of extracting light from the LED device, and has high luminous intensity.

Another of the aspects of the invention is a method for manufacturing an LED device that includes: preparing a multiple LED substrate in which a plurality of concave portions are provided at predetermined intervals and adjacent concave portions are in communication with each other via space communicating regions; mounting LED chips in the concave portions, respectively; injecting a transparent resin with a fluorescent material added thereto from at least one of the space communicating regions to fill the concave portions and the space communicating regions with the transparent resin and to embed the LED chips mounted in the concave portions; and forming a resin encapsulation having a predetermined shape from a transparent resin on the substrate.

In the above-described method for manufacturing an LED device, each of the concave portions may have an approximately circular cross section when cut along a plane parallel to a plane including the substrate.

In the above method for manufacturing an LED device, each of the space communicating regions may have an approximately circular cross section when cut along a plane parallel to a plane including the substrate.

In the above method for manufacturing an LED device, the resin encapsulation may constitute a lens that is convex toward a light-emitting direction of a corresponding one of the LED chips and has a center approximately on an optical axis of the corresponding LED chip. In this case, the lens can be one of a spherical lens and an aspherical lens.

In the above method for manufacturing an LED device, the concave portion may have a cup shape.

Another aspect of the invention is an LED device. The LED device can include a substrate having a concave portion and a space communicating region for filling a resin. The space communicating region can be positioned adjacent or around the concave portion and an LED chip can be mounted within the concave portion at a center thereof. A transparent resin can be filled from the space communicating region to the concave portion to embed the LED chip, the transparent resin being mixed with a wavelength conversion material such as a fluorescent material. A transparent resin for forming a resin encapsulation above the LED chip in a predetermined shape can also be included.

According to another aspect of the invention, the LED device manufacturing method can include using the substrate on which the LED chips are mounted and in which the space communicating region (through which adjacent concave portions are in spatial communication with each other) is provided, and filling the concave portion with a wavelength conversion material such as a fluorescent resin from a flow originating from the space communicating region, and not from above the concave portion in which the LED chip is mounted. Thereby the LED chips can be embedded in the fluorescent resin in the respective concave portions due to natural flow of the fluorescent resin so as to be encapsulated.

Thus, a bonding wire does not obstruct injection of the fluorescent resin and it is therefore possible to consistently encapsulate the LED chip mounted in each concave portion with the resin.

Moreover, the wavelength conversion material (e.g., fluorescent resin) can diffuse to all the concave portions and the space communicating regions due to its natural flow from at least one space communicating region. Thus, the height of the filled fluorescent resin can become even throughout the concave portions and the space communicating regions. Therefore, it is possible to fill each concave portion with the fluorescent resin in a quantitative manner. Also, the thickness of the fluorescent resin on a light-emitting surface of the LED chip mounted in each concave portion becomes even. Furthermore, it is possible to achieve an LED device having a small variation of color tone of light between products.

In addition, since the concave portions and the space communicating regions can be connected to one another, the capacity that is filled with the fluorescent resin as a whole is large. Thus, even if an error occurs in the amount of injected fluorescent resin, the error is dispersed throughout the concave portions and the space communicating regions and can have little or no effect on an error of the amount of the resin in each concave portion. That is, accuracy of the filling amount of the fluorescent resin with respect to the concave portion can be easily improved, and accuracy of the filling amount of the fluorescent resin between the concave portions can also be easily improved. Therefore, it is possible to achieve an LED device having a small variation in color tone of light between products and achieve light having a desired color tone in an individual LED device.

Since the fluorescent resin that is injected into at least one space communicating region can diffuse to all the concave portions and the space communicating regions due to its natural flow, all the concave portions can be filled with the fluorescent resin by one injection operation. Thus, operating efficiency can be improved, resulting in improvement of productivity.

Furthermore, a condenser made of a transparent resin can be formed above the concave portion in which the LED chip is mounted. Due to this, light that is emitted from the LED chip and that is radiated to the outside of the LED device (to the air) can be collected in one direction so as to increase the luminous intensity of the LED device on its optical axis. It is also possible to easily obtain a desired light distribution property.

BRIEF DESCRIPTION OF THE DRAWINGS

These and other characteristics, features and advantages of the invention will become clear from the following description with reference to the accompanying drawings, wherein.

DETAILED DESCRIPTION OF PREFERRED EMBODIMENTS

Figure 1:
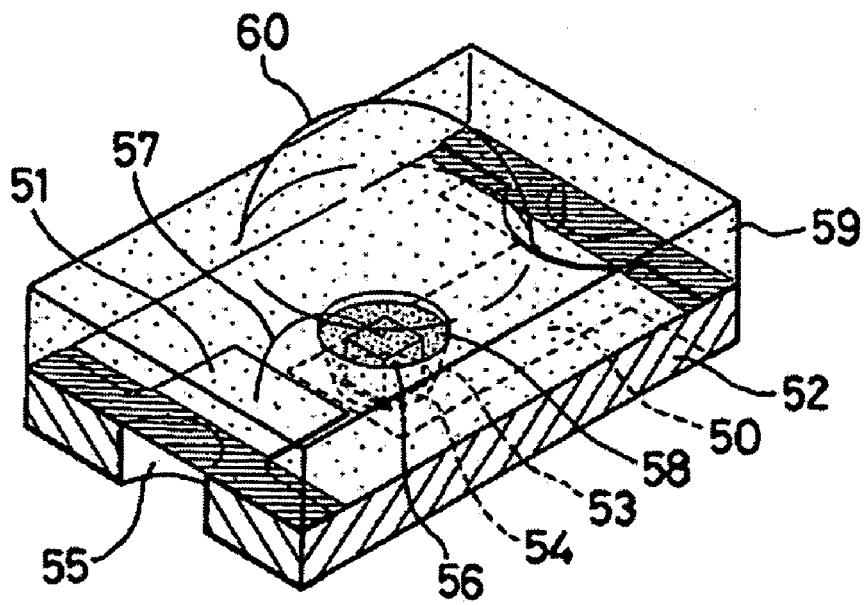
FIG. 1 is a perspective view of an LED device manufactured by a conventional manufacturing method.
Figure 2:
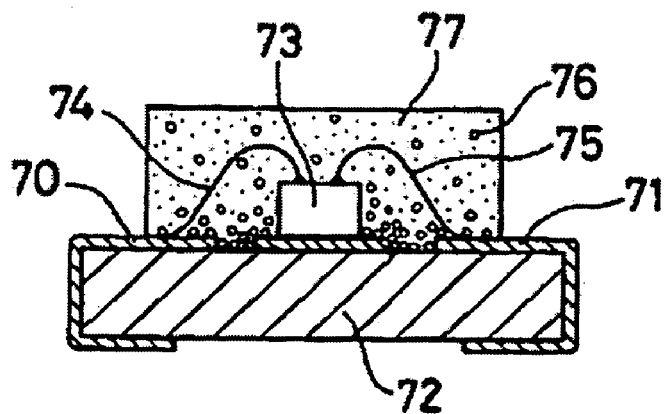
FIG. 2 is a vertical cross-sectional view of an LED device manufactured by another conventional manufacturing method.

An exemplary embodiment of the invention will now be described in detail, with reference to FIGS. 3A to 3E, 4A, 4B, and 5 (the same or similar components are labeled with the same reference numerals). The exemplary embodiment to be described hereinafter is an example of the invention, and various technical features are imposed thereon. However, the scope of the invention is not limited to the exemplary embodiment.

Figure 3A:
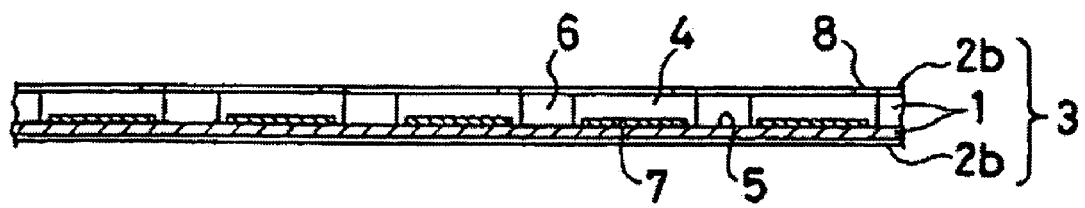
FIGS. 3A, 3B, 3C, 3D and 3E show respective processes of an LED device manufacturing method according to an exemplary embodiment of the invention.

FIGS. 3A to 3E are cross-sectional views showing respective processes of an LED device manufacturing method according to an embodiment of the invention. FIG. 4A is a top plan view corresponding to the process of FIG. 3A and FIG. 4B is a top plan view corresponding to the process of FIG. 3B.

First, a multiple LED substrate 3 having a plurality of LED device regions is prepared, as shown in FIGS. 3A and 4A. This substrate 3 can include an insulating portion 1 formed by an insulating member and a pair of conductor patterns 2a and 2b. These conductor patterns 2a and 2b can be formed on surfaces of the insulating portion 1 such that they are opposed to each other. The conductor patterns 2a and 2b can also be formed on edges of the top surface of the substrate 3 along a longitudinal direction thereof to extend from those edges to the rear surface of the substrate 3 via side faces, respectively.

A plurality of first cups 4 (concave portions) can be provided on the top surface of the substrate 3 at positions between the opposed conductor patterns 2a and 2b along the longitudinal direction of the substrate 3 at regular intervals. The plurality of first cups 4 can have approximately the same shape and approximately the same dimensions and can be substantially concave.

A space communicating region, such as a second cup 6, can be formed between the adjacent first cups 4. The second cup 6 is concave and can include a bottom 5 with approximately the same depth as that of the first cup 4. The first cups 4 and the second cups 6 can be connected to each other at their bottoms.

A die bonding pad 7 formed of a conductor pattern can be provided at least at the bottom 5 of each first cup 4. The die bonding pad 7 can be connected to one of the conductor patterns 2a and 2b. For example, the conductor pattern 2a, formed on the edges of the top surface of the substrate 3, can be connected to the die bonding pad 7 via the conductor pattern 2c (see FIG. 4A) extending from the conductor pattern 2a. A wire bonding pad 8 can be formed to extend from the other conductor pattern 2b approximately toward the first cup 4.

Figure 3B:
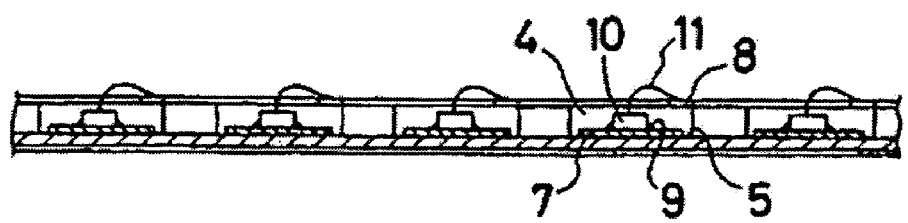
Figure 4A:
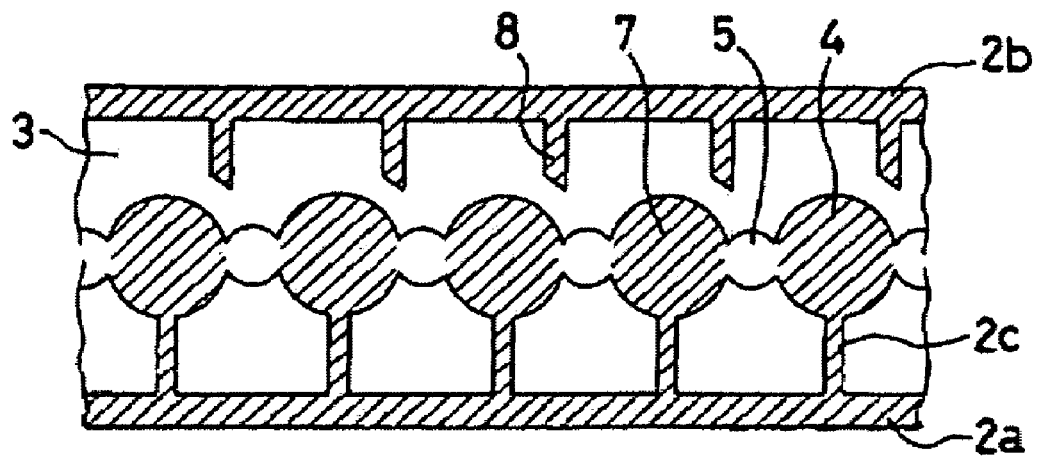
FIGS. 4A and 4B are top plan views of the processes shown in FIGS. 3A and 3B, respectively.
Figure 4B:
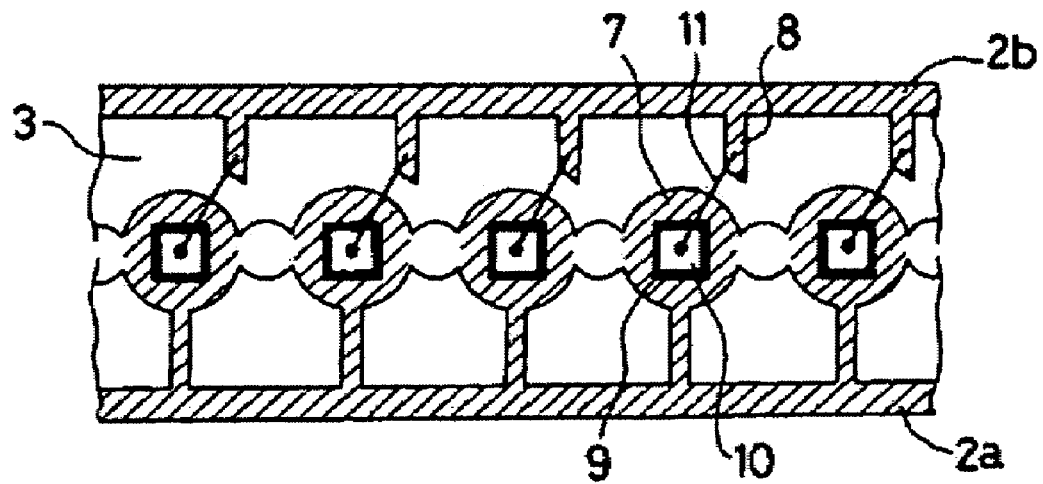

Next, as shown in FIGS. 3B and 4B, LED chips 10 can be mounted on the respective die bonding pads 7 at the bottoms 5 of the first cups 4 formed in the substrate 3 via a conductive adhesive 9 or the like. A lower electrode of each LED chip 10 is electrically connected to the die bonding pad 7 formed on the bottom of the first cup 4. An upper electrode of each LED chip 10 can be connected to the corresponding wire bonding pad 8 via a bonding wire 11 so as to be electrically connected to the wire bonding pad 8.

Figure 3C:
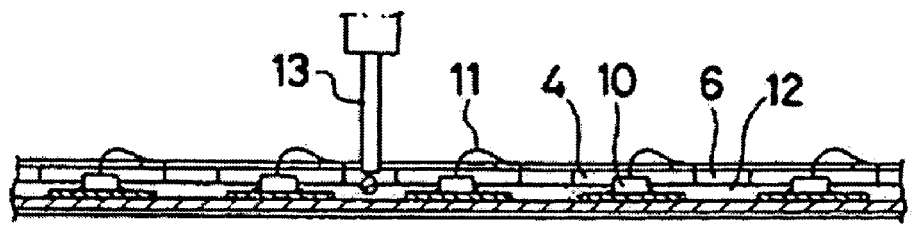

Then, as shown in FIG. 3C, the first cups 4 in which the LED chips 10 are respectively mounted and the second cups 6 are filled with a wavelength conversion material, such as a fluorescent resin 12 that contains a transparent resin with a fluorescent material added thereto. The fluorescent resin 12 can be supplied by a discharging device for discharging liquid of a constant amount, such as a dispenser. In the filling process, a nozzle 13 of the device for discharging the fluorescent resin 12 can be arranged in such a manner that a top end of the nozzle 13 is inserted into the second cup 6 serving as an injection port of the fluorescent resin 12 (and not above the first cup 4 in which the LED chip 10 is mounted). The device thus arranged injects the fluorescent resin 12 into the inside of that second cup 6. The injected fluorescent resin 12 can thus gradually diffuse to all of the first and second cups 4 and 6 due to its natural flow. When all of the first and second cups 4 and 6 have been filled with a predetermined amount of the fluorescent resin 12, injection of the fluorescent resin 12 is stopped. Then, the fluorescent resin 12 can be heated to be hardened.

This process is a process for filling the first cups 4 that include the LED chips 10 therein, respectively, with the fluorescent resin 12 and embedding and encapsulating the LED chips 10 with the fluorescent resin 12.

Thus, in this particular exemplary embodiment of the invention, the nozzle 13 for discharging the fluorescent resin 12 is not arranged above the first cup 4 that includes the LED chip 10 therein, but is arranged in such a manner that its top end is inserted into the second cup 6 that is connected to the first cup 4 at the bottom 5. The fluorescent resin 12 is injected from the thus arranged nozzle 13 into the second cup 6 and is diffused throughout the first cups 4 and the second cups 6 due to natural flow. As a result, it is possible to consistently encapsulate the LED chips with the fluorescent resin 12 without obstruction of the bonding wire 11.

Moreover, the height of the fluorescent resin 12 can become even throughout the first and second cups 4 and 6 because the fluorescent resin 12 injected into and flowing from the inside of the second cup 6 is diffused due to its natural flow. Thus, each of the first cups 4 can be quantitatively and predictably filled with the fluorescent resin 12, and the thickness of the fluorescent resin 12 on the light-emitting surface of the LED chip 10 can be predictable and even. Such an even thickness of the fluorescent resin 12 contributes to achievement of an LED device that has a small variation in color tone of light between products.

Since all the first and second cups 4 and 6 can be connected to one another, the capacity filled with the fluorescent resin as a whole is large. Thus, even if an error occurs in the injected amount of the fluorescent resin 12, that error is dispersed throughout the first and second cups 4 and 6 and has almost no detrimental effect on the amount of the fluorescent resin 12 in each first cup 4. That is, accuracy of the filling amount of the fluorescent resin 12 with respect to the first cup 4 can be easily improved and accuracy of the filling amount of the fluorescent resin 12 between the first cups 4 can also be easily improved. The thus improved accuracy of the filling amount of the fluorescent resin 12 also contributes to achievement of an LED device that has a small variation in color tone of light between products, and can achieve light of a desired color tone in an individual LED device.

Figure 3D:
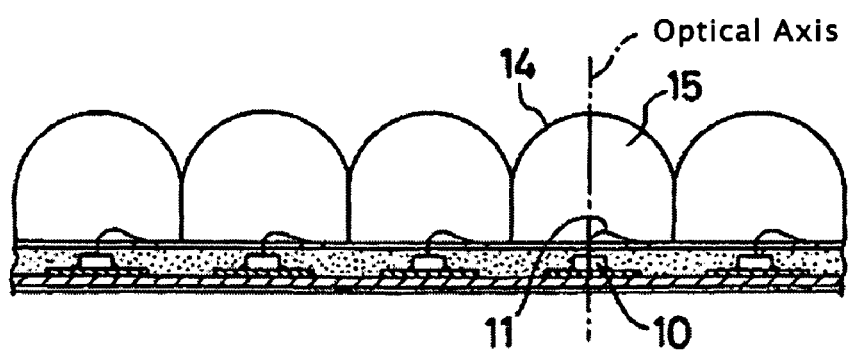

Next, as shown in FIG. 3D, convex condensers 14 made of a transparent resin can be formed in such a manner that each convex condenser 14 has its center approximately on the optical axis of the corresponding LED chip 10 and becomes convex toward a light-emitting direction of the corresponding LED chip 10. The bonding wires 11 can also be encapsulated with the transparent resin 15. The transparent resin can be heated to be hardened.

The condenser can be one of a spherical lens and an aspherical lens and is chosen and designed in an appropriate manner to achieve a light distribution property required for light emitted from the LED device.

Encapsulation of the bonding wires 11 with the transparent resin can protect the bonding wires 11 against external stress such as mechanical vibration or impact, for example. Forming of the condenser from the transparent resin is done to collect light that is emitted from the LED chip and radiated to the outside of the LED device (to the air) in one direction so as to increase the luminous intensity of the LED device on its optical axis and to obtain a desired light distribution property.

Figure 3E:
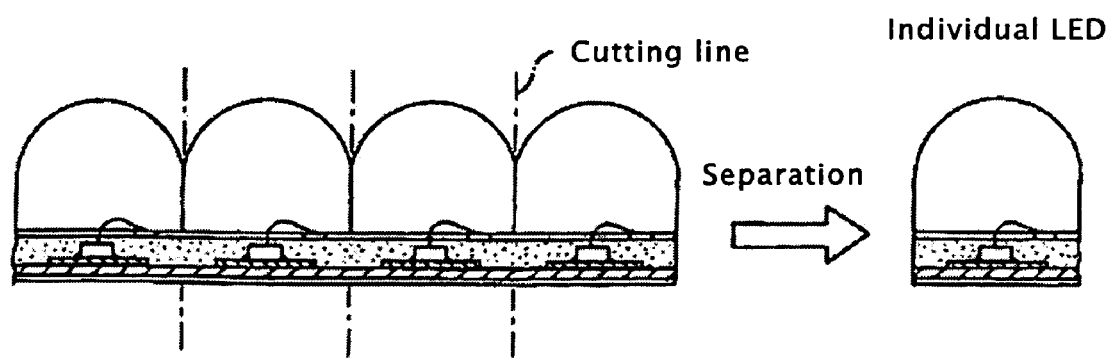

Finally, as shown in FIG. 3E, a plurality of LED devices that are completed while being connected to each other on the multiple LED substrate can be cut by dicing, slicing, etc., so that the LED devices are separated from each other.

Figure 5:
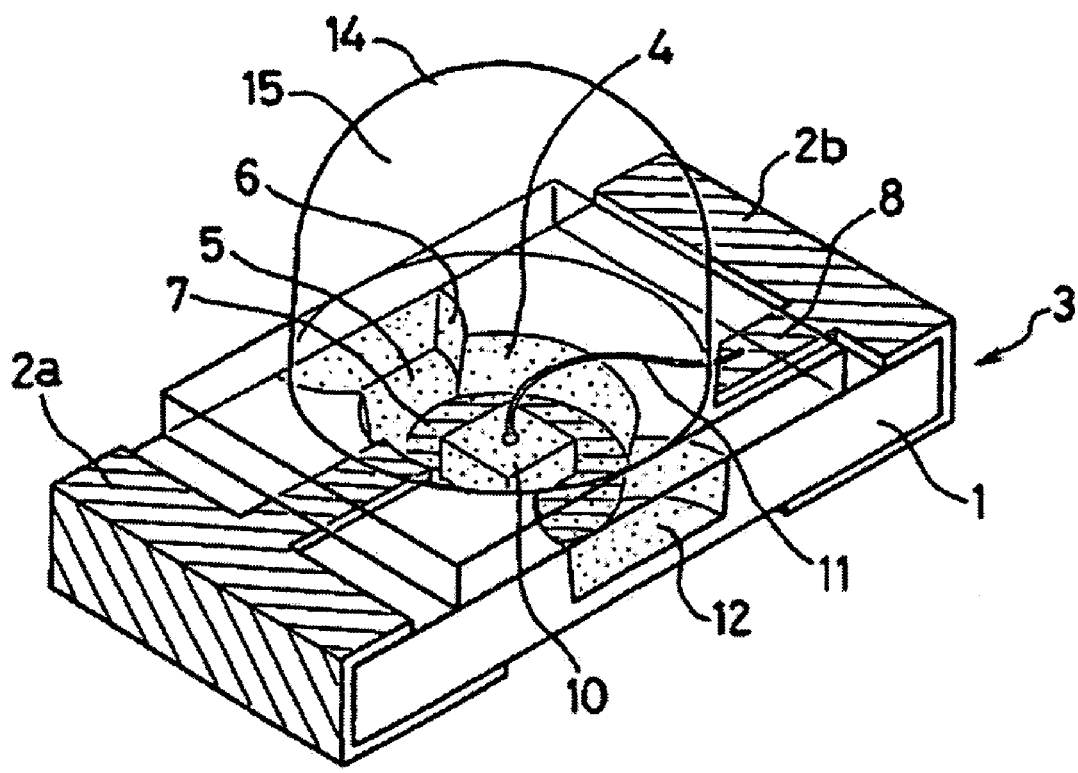
FIG. 5 is a perspective view of an LED device manufactured by the LED device manufacturing method depicted in FIGS. 3A-E.

FIG. 5 is a perspective view of one LED device after separation. The pair of conductor patterns 2a and 2b are depicted as being formed on the insulating portion 1. The conductor patterns 2a and 2b can be arranged to extend from the top surface of the insulating portion 1 to the rear surface via the side faces, respectively. The LED chip 10 is shown as being mounted on the die bonding pad 7 that is connected to one conductor pattern 2a and provided at the bottom of the first cup 4. The upper electrode of the LED chip 10 can be connected to the wire bonding pad 8 extending from the other conductor pattern 2b via the bonding wire 11. The first cup 4 in which the LED chip 10 is mounted and the second cups 6 that are connected to the first cup 4 at their respective bottoms can be filled with the fluorescent resin 12 that contains transparent resin and has fluorescent material added thereto. The convex condenser 14 can have a center approximately on the optical axis of the LED chip 10 and can be made of a transparent resin. The condenser 14 can be formed above the first cup 4 in which the LED chip 10 is mounted, thereby forming an encapsulation 15 of the transparent resin.

In the exemplary embodiment described above, the second cup provided between the adjacent first cups can be formed to have an approximately circular cross section when being cut along a plane parallel to a plane including the substrate. However, the shape of the second cup is not specifically limited, as long as the bottoms of the adjacent first cups are connected to (in fluid communication with) each other. A cross-sectional shape of a portion for connecting the adjacent first cups when being cut along a plane parallel to a plane including the substrate is appropriately chosen and designed from combinations of one or more curves and/or one or more straight lines, considering a method for manufacturing the substrate, the dimensions of the first cup, the diameter of the nozzle of the discharging device for discharging liquid of a constant amount, the viscosity of the fluorescent resin, and the like.

The number of the nozzles of the discharging device for injecting the fluorescent resin is not limited to one. A plurality of nozzles may be arranged so as to simultaneously perform injection at a plurality of positions. In this case, time required for injecting the fluorescent resin can be shortened and operating efficiency can be improved.

As described above, according to an LED device manufacturing method, a plurality of concave portions (e.g., first cups) that contain LED chips therein, respectively, are formed in a multiple LED substrate having a plurality of LED regions. A plurality of space communicating regions, such as second cups or the like can be formed between the first cups so as to connect the bottoms of the adjacent first cups. Then, a top end of a nozzle of a liquid discharging device can be inserted into one or more of the second cups, and a fluorescent resin containing a transparent resin with a fluorescent material added thereto can be injected.

That is, the fluorescent resin flows from the second cup(s) into the first cup(s), not from above the first cup(s) containing the LED chip. The injected fluorescent resin is diffused due to its natural flow from the second cup(s) to all or a desired amount of the first and second cup(s). Thus, injection of the fluorescent resin is not obstructed by the bonding wire and the LED chips respectively mounted in the first cups are consistently encapsulated with the resin.

Since the fluorescent resin flowing from the second cup can be diffused to all the first and second cups due to its natural flow, the height of the fluorescent resin can be even throughout the first and second cups. Thus, each first cup is filled with the fluorescent resin quantitatively and the thickness of the fluorescent resin on a light-emitting surface of the LED chip mounted in each first cup can also be even. Thus, it is possible to achieve an LED device having small variation in color tone of light between products.

Moreover, the capacity filled with the fluorescent resin is large as a whole because the first and second cups 4 and 6 can be connected to each other. Thus, even if an error occurs in the injected amount of the fluorescent resin, the error is dispersed throughout the first and second cups 4 and 6 and has almost no effect on the amount of fluorescent resin in each first cup. That is, accuracy of the filling amount of the fluorescent resin with respect to the first cup can be easily improved and accuracy of the filling amount of the fluorescent resin between the first cups can also be easily improved. Thus, it is possible to achieve an LED device having small variation in color tone of light between products and to achieve light of a desired color tone in an individual LED device with high precision.

In addition, the fluorescent resin injected into the second cup is diffused due to its natural flow from that second cup to the first and second cups. Thus, the first cups can be filled with the fluorescent resin by one injection operation. Therefore, the operating efficiency can be improved, resulting in improvement of productivity.

It should be noted that the wavelength conversion material can be injected into the first cup(s), second cup(s), or both the first and second cups. In addition, the injection can take place at locations along, at the end, or within the structure formed by the concave portions (in which LED chips are located) and the space communicating regions that connect the concave portions.

A condenser made of a transparent resin can be formed above the first cup in which the LED chip is mounted. Thus, excellent effects can be obtained in that light that is emitted from the LED chip and that is radiated to the outside of the LED device (to the air) can be collected in one direction so as to increase the luminous intensity of the LED on its optical axis and a desired light distribution property can be obtained.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A method for manufacturing an LED device comprising:
    providing a multiple LED substrate in which a plurality of concave portions are provided at predetermined intervals and adjacent concave portions are in communication with each other via space communicating regions;
    locating LED chips in the concave portions, respectively;
    causing a transparent resin with a wavelength conversion material added thereto to flow from at least one of the space communicating regions to fill the concave portions and the space communicating regions with the transparent resin and to embed the LED chips located in the concave portions; and
    forming a resin encapsulation having a predetermined shape on the substrate.

2. The method for manufacturing an LED device according to claim 1, wherein each of the concave portions has an approximately circular cross section when cut along a plane parallel to a plane including the substrate.

3. The method for manufacturing an LED device according to claim 1, wherein each of the space communicating regions has an approximately circular cross section when cut along a plane parallel to a plane including the substrate.

4. The method for manufacturing an LED device according to claim 2, wherein each of the space communicating regions has an approximately circular cross section when cut along a plane parallel to a plane including the substrate.

5. The method for manufacturing an LED device according to claim 1, wherein the resin encapsulation constitutes a lens that is convex toward a light-emitting direction of a corresponding one of the LED chips and has a center approximately on an optical axis of the corresponding LED chip.

6. The method for manufacturing an LED device according to claim 2, wherein the resin encapsulation constitutes a lens that is convex toward a light-emitting direction of a corresponding one of the LED chips and has a center approximately on an optical axis of the corresponding LED chip.

7. The method for manufacturing an LED device according to claim 3, wherein the resin encapsulation constitutes a lens that is convex toward a light-emitting direction of a corresponding one of the LED chips and has a center approximately on an optical axis of the corresponding LED chip.

8. The method for manufacturing an LED device according to claim 4, wherein the resin encapsulation constitutes a lens that is convex toward a light-emitting direction of a corresponding one of the LED chips and has a center approximately on an optical axis of the corresponding LED chip.

9. The method for manufacturing an LED device according to claim 5, wherein the lens is one of a spherical lens and an aspherical lens.

10. The method for manufacturing an LED device according to claim 6, wherein the lens is one of a spherical lens and an aspherical lens.

11. The method for manufacturing an LED device according to claim 7, wherein the lens is one of a spherical lens and an aspherical lens.

12. The method for manufacturing an LED device according to claim 8, wherein the lens is one of a spherical lens and an aspherical lens.

13. The method for manufacturing an LED device according to claim 1, wherein at least one of the concave portions has a cup shape.

14. The method for manufacturing an LED device according to claim 2, wherein at least one of the concave portions has a cup shape.

15. The method for manufacturing an LED device according to claim 3, wherein at least one of the concave portions has a cup shape.

16. The method for manufacturing an LED device according to claim 4, wherein at least one of the concave portions has a cup shape.

17. The method for manufacturing an LED device according to claim 5, wherein at least one of the concave portions has a cup shape.

18. The method for manufacturing an LED device according to claim 9, wherein at least one of the concave portions has a cup shape.

19. The method for manufacturing an LED device according to claim 1, wherein the wavelength conversion material is a fluorescent material.

20. The method for manufacturing an LED device according to claim 5, wherein causing a transparent resin with a wavelength conversion material added thereto to flow includes injecting a wavelength conversion material into one of: the space communicating regions and the concave portions.

21. The method for manufacturing an LED device according to claim 5, wherein causing a transparent resin with a wavelength conversion material added thereto to flow from at least one of the space communicating regions to fill the concave portions and the space communicating regions includes entirely filling the concave portions and the space communicating regions with the transparent resin.

* * * * *